United States Patent [19]

Sadoway et al.

[11] Patent Number: 4,971,663
[45] Date of Patent: Nov. 20, 1990

[54] CRYOELECTROSYNTHESIS

[75] Inventors: Donald R. Sadoway, Belmont; Robert M. Rose, Wenham, both of Mass.

[73] Assignee: Massachusetts Institute of Technology, Cambridge, Mass.

[21] Appl. No.: 299,762

[22] Filed: Jan. 23, 1989

Related U.S. Application Data

[63] Continuation-in-part of Ser. No. 179,047, Apr. 8, 1988.

[51] Int. Cl.$^5$ ............................................... C25B 1/00
[52] U.S. Cl. .................................... 204/56.1; 204/58.5
[58] Field of Search ............................. 204/56.1, 58.5

[56] References Cited

U.S. PATENT DOCUMENTS 4,517,253  5/1985  Rose et al. ......................... 204/58.5

OTHER PUBLICATIONS

Zurawski, "Towards the Electromechanical Synthesis of High Temperature Superconductors", Jun. 1988, p. 1607, J. Electrochem. Soc.: Acc. Brief. Com.

*Primary Examiner*—T. M. Tufariello
*Attorney, Agent, or Firm*—Fish & Richardson

[57] ABSTRACT

A method of chemical fabrication for producing chemical compositions composed of at least two elemental constituents at low temperatures in an electrochemical cell is provided. Preferred compositions so produced include semiconductors, superconductors and other materials useful in various applications. By virtue of the synthesis at low temperatures, degradation of the compositions due to, for example, diffusion effects, is substantially eliminated.

40 Claims, 1 Drawing Sheet

CRYOELECTROSYNTHESIS

BACKGROUND OF INVENTION

This application is a continuation-in-part to application USSN 179,047 filed Apr. 8, 1988, pending by D. R. Sadoway and R. M. Rose entitled "Electrochemically Controlled Superconductivity."

This invention relates to the fabrication of chemical compositions at low temperatures in an electrochemical cell and more particularly to the fabrication of compositions useful in electronic, photonic, magnetic, and mechanical applications and including semiconductors, superconductors and the like.

Future advances in the electronics industry will make greater use of the advantageous electrical properties of various materials such as the newly discovered high temperature superconductors and semiconductors other than silicon e.g., GaAs and CdTe. Fabrication of high quality samples of such composition using methods that meet the criteria for ultra small scale integrated circuit production are therefore necessary and at present, lacking.

A major disadvantage to many previous approaches to production of both semiconductor and superconductor materials arises from the use of high temperature processes which may induce changes in the product composition or the substrate upon which the material is layered. For example, in the production of thin films, which are commonly used in microcircuit applications, the energy introduced through a high temperature procedure may result in diffuse rather than sharp interfaces or boundaries between films due to temperature dependent diffusion effects. A diffuse interface reduces the quality and predictability of the electronic devices formed by these films.

In the field of high temperature superconductors it has been found that certain ceramic oxide superconducting materials have critical or transition temperatures of approximately 90 K. An example is $Ba_2YCu_3O_{7-x}$. The origins of superconductivity in these species are not presently well understood. The reported irreproducibility of superconducting properties and the evanescence of high temperature superconductivity reported at temperatures as high as 500° C. indicate that these materials are, at least in some respects, unstable or metastable with regard either to the phase or to the type of defects that are required for high temperature superconductivity.

All the known methods for the fabrication of these materials require processing at temperatures much higher than the critical temperatures. Thereafter (at low temperatures) the material is left to interact with its service environment which differs substantially from the processing environment. Consequently, deviation in stoichiometry, phase instability, or instability of crystal defects such as oxygen vacancy arrays which are conducive to high temperature superconductivity is possible. A suboptimal composition would result and transition temperature would suffer. Thus, because these materials appear to be unstable or metastable, the best superconducting properties themselves may be lost in the process of their very fabrication. One example of superconductor fabrication, disclosed in the commonly owned U.S. patent application Serial No. 149,621 by R. M. Latanision et al. filed Jan. 28, 1988, and entitled " Preparation of Superconducting Oxides by Electrochemical Oxidation", involves the oxidation of the desired superconductor's precursor metal alloy in an electrochemical cell to produce the superconducting oxides. Electrolytes contemplated for this method include aqueous and nonaqueous mixtures e.g., ethanol, ammonia, acetonitrile, or molten salt mixtures all of which are typically used at ambient or superambient temperatures.

Other production methods, for some semiconductors in particular, require the use of potentially hazardous materials under dangerous conditions such as high temperature and pressure. For example, to produce GaAs films, it is known to bathe a Ga substrate in a liquid As mixture at temperatures near 300° C.

In a previous patent, U.S. Pat. No. 4,517,253 we disclosed a method for electrodeposition of reactive metals, employing an anhydrous electrolyte solution which might be held at cryogenic temperatures. By this technique, the damaging effects of various prior art high temperature deposition methods could be avoided.

It is therefore the object of this invention to provide a method for production of materials, especially those useful in electronic applications such as semiconductors and superconductors that avoids the problems, e.g., high temperature effects which degrade the product, potentially hazardous processes, of the prior art methods.

SUMMARY OF THE INVENTION

According to one aspect of this invention, a method of chemical fabrication is claimed for producing at low temperatures in an electrochemical cell a chemical composition composed of at least two elemental constituents. The method comprises the steps of providing a first electrode at which the composition is formed, providing a second electrode to act as a counter electrode in the cell, and immersing the first and second electrodes in cryogenic electrolyte. The electrolyte contributes at least one constituent to the composition. An electrical potential difference is established between the first and second electrodes whereby the constituents form the composition at the first electrode.

In another aspect of the invention, a method of chemical fabrication is provided for producing a chemical composition composed of at least two elemental constituents at low temperatures in an electrochemical cell which comprises the steps of providing a first electrode comprised of a select material which contributes at least one constituent to the composition, providing a second electrode to act as a counter electrode in the cell, immersing the first and second electrodes in cryogenic electrolyte, the electrolyte contributing at least one constituent to the composition and providing an electrical potential difference between the first and second electrodes whereby the electrolysis product of the electrolyte chemically reacts with the first electrode to produce the composition at the first electrode.

According to yet another aspect of the invention, a method of chemical fabrication for producing a chemical composition composed of at least two elemental constituents at low temperatures comprises the steps of providing a first electrode including a select material which acts as a substrate upon which the composition is fabricated, providing a second electrode to act as a counter electrode in the cell, immersing the first and second electrodes in cryogenic electrolyte, the electrolyte contributing the constituents to fabricate the composition and providing an electrical potential difference between the first and second electrode whereby the constituents in the electrolyte are preferentially attracted to the first electrode on which they discharge and chemically react to produce the composition at the first electrode.

In yet another aspect of the invention, a method of chemical fabrication for producing a chemical composition composed of at least two elemental constituents at low temperatures in an electrochemical cell comprises the steps of providing a first electrode, the first electrode comprising a consumable electrode that electrodissolves upon being polarized and supplies at least one constituent to the composition, and providing a second electrode to act as a counter electrode in the cell, and immersing the first and second electrodes in cryogenic electrolyte. An electrical potential difference between the first and second electrodes is provided whereby the constituents of the composition form the composition at the second electrode. In some embodiments the electrolyte contributes at least one constituent to the composition. In others the second electrode may contribute at least one constituent. In yet others, both the electrolyte and the second electrode contribute constituents along with the consumable electrode. In still other embodiments all the constituents are Provided from consumable electrodes.

In various preferred embodiments of this invention, the first electrode is the cathode and the second electrode is an anode. In other preferred embodiments, the first electrode is the anode and the second electrode is the cathode.

In some preferred embodiments of the invention the composition formed is a superconductor, the first electrode is substantially composed of an alloy of the metals of the superconductor, the electrolyte is oxygen bearing and the composition is the superconducting oxide of the metal alloy. In a particularly preferred embodiment the electrolyte is held substantially near or below the temperature at which the oxide becomes superconducting.

According to other aspects of the invention the thickness of the composition may be controlled coulometrically. In a preferred embodiment, the composition formed is of substantially greater length than width and the conductance of the composition is substantially greater along points on a single face of the length than across the width.

DESCRIPTION OF THE PREFERRED EMBODIMENTS

Using the present techniques, the inventors generate materials in an electrolytic cell using nonaqueous electrolytes by an approach that is fundamentally low temperature and low energy. The approach discussed herein can be used to produce a variety of materials including superconductors and semiconductors at low temperatures with a control of structure that is not possible in higher temperature processes. Furthermore, the thickness can be controlled coulometrically to within a monolayer.

Figure 1:
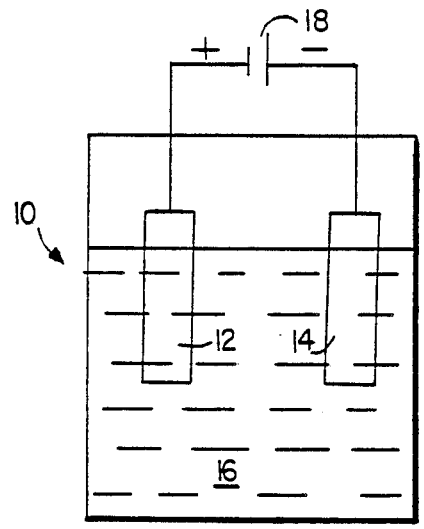
FIGS. 1 and 2 are schematic illustrations of the electrochemical cell described herein.

With reference to FIG. 1, a preferred embodiment of the invention for the fabrication of a high temperature superconductor will first be described. An electrochemical cell 10 according to the invention includes an anode 12 which is the metal alloy precursor of the stoichiometric proportions corresponding to a superconducting species, in the Present example, the copper containing oxides with a perovskite-related crystal structure such as barium yttrium cuprate, $Ba_2YCu_3O_{7-x}$. The electrode may be formed, for example, by melt spinning. An oxygen bearing electrolyte 16 is preferably held at cryogenic temperatures and a potential difference is applied across the anode 12 and cathode 14 using the potentiostat 18. The resulting reaction at the anode 12 is thus the oxidation of the metal precursor to produce the superconducting oxide.

The counterelectrode 14 is an electronic conductor at which a faradaic process occurs to electrically balance the synthesis process occurring at the working electrode, in this embodiment, the anode. Examples include electrodes at which reduction reactions of metals occur that either result in metal deposition or change in valence; reduction of $Fe^{3+}$ to $Fe^{2+}$ or to $Fe^0$, for example where in the former both ionic species remain in solution and in the latter, elemental iron electrodeposits. Another example for the counter electrode is an electrode based upon an equilibrium involving oxygen which would establish a reference voltage through such a reaction, as is known. For example, at temperatures above the normal boiling point of oxygen, oxygen gas can be bubbled over a solid substrate such as platinized platinum in order to conduct such a reaction. When the counterelectrode is such a reference electrode, the electrochemical cell 10 can be termed a concentration cell.

An important aspect of the present invention is the electrolyte 16 which contacts both the anode 12 and cathode 14 and is held at cryogenic temperatures. In this preferred embodiment for the production of superconductors, the electrolyte is held near the value of $T_c$. The electrolyte 16 may be a solid or a liquid. However, at the low temperatures of operation presently required of cuprate-based superconducting oxides, a liquid electrolyte is preferred. Such an electrolyte thus remains liquid at the operating temperature of the cell 10 which is near the critical temperature, $T_c$, of the superconducting material. The electrolyte 16 in the present embodiment must be an oxygen-bearing medium in which the dominant mode of electrical conductivity is ionic. The potential window, that is to say the range of voltage to which the electrolyte can be subjected, must be such that it does not decompose under the conditions of operation of the cell 10. Aqueous electrolytes cannot be used for this purpose since the potential window is too narrow, cuprate-based oxides are chemically attacked by, that is to say react with, water and most aqueous electrolytes mixtures are solids at temperatures corresponding to $T_c$. Because barium yttrium cuprate has a critical temperature around 90 K, the electrolyte 16 must remain liquid at this temperature. It is contemplated that the electrolyte 16 will be a multicomponent solution. In this case, it is not necessary that each and every constituent of such a multicomponent electrolyte satisfy the selection criteria. Two examples of liquids that form the basis of a satisfactory electrolyte are ozone, chemical formula $O_3$, and trifluoronitrosomethane, chemical formula $CF_3NO$.

The superconducting cuprate anode 12 and counterelectrode 14 are connected to the power supply such as, for example, a potentiostat 18 which applies an electrical potential between the superconductor electrode 12 and the counterelectrode 14. The superconductor electrode 12 is charged positive with respect to the counterelectrode 14, and an adjustable DC voltage is maintained between the two electrodes.

The reaction resulting at the anode 12 in the present example is thus the oxidation of the metal precursor to produce the superconducting oxide, barium yttrium cuprate $Ba_2YCu_3O_{7-x}$ but it will be appreciated by those skilled in the art that the present invention applies to all members of the recently discovered class of high temperature ceramic superconductors. For example, other elements such as bismuth, strontium, calcium, aluminum and many of the rare earth elements may be substituted for the yttrium and the barium.

Among the attributes of this low temperature synthesis process are the following: by performing the electrochemical synthesis at temperatures at which the material generated is superconducting, there is no electrical resistance to impede deposition of subsequent layers of material. The only barrier is diffusion of material across the deposited film. That is to say, the film would continue to form either through the diffusion of the elements across the film to the interface between the film and the electrolyte, or through the diffusion of oxygen across the film to the interface between the metal and the film. If the film is formed at cryogenic temperatures above which the material is superconducting, then in addition to the diffusive barrier there is the electrical resistance barrier. Variation of the potential difference would provide another parameter to control film thickness. Furthermore, a combination of the effects of the resistance and diffusion barriers as well as potentiostatic control can be used in coordination to tailor the thickness and uniformity of the film. Furthermore, superconducting structures could be formed on metal substrates by plating the alloy precursor onto such a substrate and producing the superconductor as described, herein, above.

In another embodiment of the invention for producing a semiconductor, the anode 12, in FIG. 1 may be elemental Cd and the electrolyte 16 would consist of a solution of $H_2Te$ and selected salts to render the electrolyte sufficiently conductive. In this example ions containing Te would be attracted to the anode and at which point they would electrochemically discharge to produce Te which reacts with the Cd substrate to form the semiconductor CdTe. The reaction would likewise be carried out under cryogenic conditions to obtain the benefit of low energy synthesis and to maintain the electrolyte $H_2Te$ which is known to freeze at 228 K and boil at 235 K under an applied pressure of 1 atmosphere.

In another embodiment the anode could be made of elemental Zn and an electrolyte mixture including $H_2Se$ would be provided. Electrolysis of the electrolyte would discharge Se-bearing ions at the anode to produce elemental Se which then reacts with the zinc substrate to form ZnSe. In a modification of this method, the formation of p-type ZnSe is achieved by the introduction of lithium, produced from lithium ions supplied by a lithium salt in the electrolyte. Alternatively, ZnSe may be p-doped with hydrogen through reversal of the electrode polarity so as to cause the ZnSe to be cathodic. In this way the electrode reaction is altered to be hydrogen discharge thereby producing hydrogen atoms which may be incorporated into the ZnSe so produced. Cycling the polarity allows the reaction to switch from ZnSe synthesis to hydrogen discharge and produce homogeneous, relatively thick p-doped ZnSe films. Furthermore, it will be apparent to those skilled in the art that the level of doping may be controlled by proper potentiostatic control of the electrochemical cell. In this example, the reaction must be carried out cryogenically, for example, between about 208 K and 232 K to avoid freezing or boiling, respectively, of the $H_2Se$ electrolyte.

In yet another embodiment a Ga anode and a cryogenic electrolyte including $AsH_3$ may be provided to produce GaAs at the anode. The reaction being carried out, for example, between approximately 157 K and 218 K to avoid freezing or boiling, respectively, of the electrolyte.

In another example, a liquid anode consisting of an amalgam of Cd and Hg and an electrolyte mixture including $H_2Te$ is provided. This embodiment results in the formation of $(HgCd)Te_2$, a semiconductor with many known uses, including detection of infrared radiation.

Figure 2:
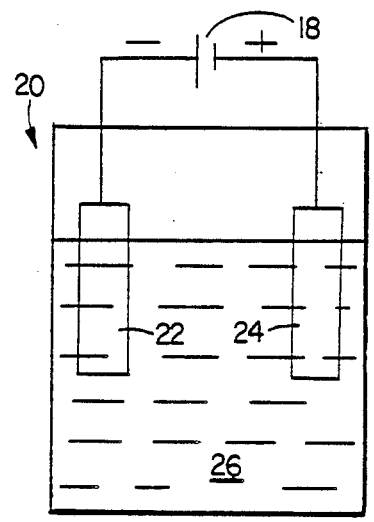

With reference now to FIG. 2, examples of material produced at the cathode of an electrochemical cell with a cryogenic electrolyte will be discussed. A cathode 24 composed substantially of elemental La and a cryogenic, boron bearing electrolyte 26 which may include $BF_3$, a liquid at cryogenic temperatures, for example between about 146 K and 173 K (melting and boiling points, respectively of $BF_3$), a fluoride salt, e.g. NaF or LiF, to enhance conductivity and $B_2O_3$ is provided. The anode 24 may be any inert metallic conductor. In this embodiment, the electronic material $LaB_6$ is produced at the cathode 24.

In another example, for the production of iron neodymium boron magnetic materials, a cathode 24 substantially consisting of an alloy of Fe and Nd in the selected stoichiometric proportions is provided along with a boron bearing electrolyte, e.g., $BF_3$ in solution with $NdF_3$ and $B_2O_3$. In this embodiment, the electrolysis product, boron, would react at the cathode, of Fe-Nd alloy, to produce $Nd_2Fe_{14}B$.

In another embodiment of the invention a consumable electrode may be employed. This type of electrode, upon being polarized electrodissolves into the electrolyte as charged ions which may then react, with ions provided from other sources, e.g., other consumable electrodes, the electrolyte, chemical species engaged in electrochemical reactions on nonconsumable electrodes or any combination of the above. For electrolytes already containing constituent ions, the consumable electrode resupplies the ions to maintain a steady state.

Such reaction may be carried out at low temperatures. For example, a consumable boron anode may be electrodissolved into the electrolyte. The boron ions are then transported to a lanthanum cathode substrate on which the boron deposits and chemically bonds with the lanthanum to form $LaB_6$. In another example at least one of the constituents may be provided by the electrolyte and at least one provided by a consumable electrode, and the product formed at an inert counter electrode. For example, a consumable anode of elemental boron may be provided in an electrolyte including $BF_3$, NaF, $B_2O_3$ and $La_2O_3$, the latter component supplying lanthanum ions. In this embodiment the boron and lanthanum discharge and react at the inert cathode to form $LaB_6$.

In other embodiments all the constituents of the composition are supplied from consumable electrodes and the composition forms on an inert electrode. For example, multiple anodes may be provided which are held at a different potential from an inert cathode held at ground potential. For the formation of $LaB_6$, for example, two anodes, one of elemental lanthanum, the other of elemental boron might be provided in an electrolyte solution including, for example, BF$_3$, NaF and B$_2$O$_3$. The anodes electrodissolve, supplying lanthanum and boron ions which discharge and react at an inert cathode to form LaB$_6$.

In yet another embodiment, at least one of the constituents of the composition is supplied from a consumable electrode, the electrolyte and a reactive counter electrode. For example, an iron cathode and consumable boron anode may be provided in an electrolyte including BF$_3$, NaF, Nd$_2$O$_3$ and NdF$_3$, the latter two components supplying neodymium ions. The consumable anode electrodissolves supplying boron ions which along with the neodymium ions in the electrolyte discharge and react with the iron of the cathode to form Nd$_2$Fe$_{14}$B.

Employing the present invention also allows producing compositions under cryogenic conditions in which all the constituents of the composition are provided by the electrolyte and the electrode serves as a substrate upon which the composition forms. For example, an electrolyte providing both Ga and As ions by way of a solution of their respective salts would product GaAs at an inert cathode. More specifically, the electrolyte could be a mixture of BF$_3$, NaF, and Ga$_2$O$_3$ to provide Ga ions, and NaAsO$_3$ to provide As ions. In this case, both Ga and As ions discharge to form GaAs at the cathode.

In another example in which a plurality of constituents may be provided by the electrolyte on an electrode which itself does not contribute any constituents is the following method of forming LaB$_6$. In this case the electrolyte would include BF$_3$, NaF, B$_2$O$_3$ and La$_2$O$_3$ and any suitable inert conductor employed as the cathode at which the derived composition is formed.

It will be understood by those skilled in the art that many other cryogenic electrolyte combinations may be employed in the above discussed examples and in other examples not discussed without departing from the present invention. For example, well known cryogenic solvents such as liquid ammonia (melting point about 196 K, boiling point about 240 K) or liquid sulfur dioxide (melting point about 198 K, boiling point about 253 K) with a range of alkali metal, ammonium, silver, thallous salts, and even soluble organic compounds may also be used. Some examples are discussed in "The Chemistry of Non-aqueous Solvents" ed. J. J. Lagowski, Vol. 2, Academic Press, New York, 1969, and "Non-aqueous Solvents", by Waddington, Appleton-Century-Crofts, New York, 1969. Further, it will be recognized that one can choose the operating temperature to be any value at which the electrolyte solution is a solid or a liquid. (It is also recognized that the melting point and boiling point of the electrolyte depend on the exact composition of the solution and the temperature differential therebetween is typically broader than that of the solvent used.) Other electrolytic salts, e.g., alkali metal halides such as sodium chloride may also be used in many embodiments.

An important application of the production methods of this invention involves masking the electrode upon which fabrication is to take place to effect the synthesis of the derived composition only at chosen locations which correspond to their use in devices that make up an integrated circuit. Furthermore, it is possible to produce various compositions at various positions on a given substrate by custom masking after each cryogenic synthesis. In this way, a circuit may be formed which employs several different compositions at various locations.

The technique of this invention provides a significant advantage in terms of such multistep processing schemes since the low amounts of energy introduced in subsequent steps due to the low temperature at which the fabrication takes place would not adversely affect compositions produced in previous steps. This feature is quite unlike prior art methods which employ high temperatures in their processing steps. Using those prior art methods may limit the number of steps or types of materials used so as not to exceed an input "energy budget" above which excessive degradation of the devices occurs due to thermal effects. Furthermore, it should be evident to those skilled in the art that many other substrates could be employed as the electrode such as heavily doped (to provide conductivity) silicon which would be highly compatible and useful for production of integrated circuits. Similarly, the present invention allows formation of semiconductors and superconductors on materials, e.g. circuit boards which will not tolerate high temperatures.

A particular property of the synthesis of semiconductors on an electrode as described above is that these compounds are insulators at typical cryogenic temperatures. Thus, the synthesis becomes self limiting as the thickness of the formed material increases. Alternatively this property can be used to select the thickness of the film. By increasing the electrical Potential across the electrodes, a thicker film may be produced.

Another advantage to the present invention involves the synthesis of extremely thin films which, by virtue of their thinness exhibit differing electrical Properties across their width than along their length. Most commonly, these materials, known as two dimensional structures, are found to be electrical insulators across their thickness or width. The production of reproducible two dimensional structures, whose width may be on the order of tens of angstroms, requires careful control of the diffusion of the fabrication product into the substrate so that a sharp boundary is achieved. Since all of the current processing technologies involve ambient and superambient temperatures, it is clear that even for very short processing times the amount of diffusion taking place will be unacceptably large so as to obscure the sharp junctions required on such a fine scale. For example, using the well known relationship that the square of the diffusion distance is approximately equal to the product of the diffusion coefficient and the time ($X^2 = Dt$), one obtains that for a solute to move a distance of 10 angstroms, $10^{-7}$ cm, with a diffusion coefficient of $10^{-16}$ cm$^2$ s$^{-1}$ would take only 1 minute. These are already atypically low values of D and t, but the result is unacceptable since it is within this time that significant diffusion may take place at typical temperatures. To decrease D requires that one decrease the processing temperature. Processing at cryogenic temperatures according to the present invention dramatically reduces the diffusive motion of all species to an extent that may permit the production of such fine structures and, equally as important, and that may retain such fine scale structure through the end of the device processing sequence.

One application for such a technology is the fabrication of Josephson junction devices in which it will be necessary to make very thin films on the order of tens of angstroms. The fine boundary control of the present invention also allows the production of superconducting elements on semiconducting microcircuits and vice versa. Such hybridizing of semiconductor and superconductor elements with sharp interfaces is possible due to synthesis at low temperature with the aid of coulometric control.

Similarly, very fine epitaxial heterostructures (including those that depend on lattice strain) can be fabricated, again with very sharp interfaces.

Due to the low temperatures, chemical interaction with the substrate will be virtually nonexistent. This is also important for the fabrication of RF (particularly microwave) circuits with low electrical loss; for instance, delay lines and the family of devices based on strip lines, e.g. mixers, detectors, deconvoluters, etc.

Many modifications and variations of the present invention are possible when considered in the light of the above teachings. It is therefore understood that the scope of the present invention is not to be limited to the details disclosed herein, may be practiced otherwise than is as specifically described, and is intended only to be limited by the claims appended hereto:

What is claimed is:

1. A method of chemical fabrication for producing a chemical composition composed of at least two elemental constituents at low temperatures in an electrochemical cell comprising the steps of:
   providing a first electrode at which said composition is formed,
   providing a second electrode to act as a counter electrode in said cell,
   immersing said first and second electrodes in cryogenic electrolyte,
   said electrolyte contributing at least one constituent to said composition and
   providing an electrical potential difference between said first and second electrodes whereby said constituents of said composition form said composition at said first electrode.

2. A method of chemical fabrication for producing a chemical composition composed of at least two elemental constituents at low temperatures in an electrochemical cell comprising the steps of:
   providing a first electrode comprised of a select material which contributes at least one constituent to said composition,
   providing a second electrode to act as a counter electrode in said cell,
   immersing said first and second electrodes in cryogenic electrolyte,
   said electrolyte contributing at least one constituent to said composition and
   providing an electrical potential difference between said first and second electrodes whereby the electrolysis products of said electrolyte chemically react with said first electrode to produce said composition at said first electrode.

3. The method of claim 1 or 2 wherein said first electrode is the anode and said second electrode is the cathode.

4. The method of claim 1 or 2 wherein said first electrode is the cathode and said second electrode is the anode.

5. The method of claim 3 wherein said first electrode is substantially composed of Zn, Cd, or Hg and said electrolyte includes the dihydride $H_2S$, $H_2Se$, $H_2Te$ or $H_2Po$.

6. The method of claim 3 wherein said first electrode is composed substantially of Cd, said electrolyte includes $H_2Te$ and said composition is CdTe.

7. The method of claim 3, wherein said first electrode is composed substantially of the amalgam of cadmium and mercury, said electrolyte includes $H_2Te$, and said composition is $(HgCd)Te_2$.

8. The method of claim 3 wherein said first electrode is composed substantially of Zn, said electrolyte includes $H_2Se$ and said composition is ZnSe.

9. The method of claim 3 wherein said first electrode is composed substantially of Ga, said electrolyte includes $AsH_3$ and said composition is GaAs.

10. The method of claim 3 wherein said first electrode is substantially composed of a metal alloy having a superconducting oxide, said electrolyte is oxygen bearing and said composition is the oxide of said alloy.

11. The method of claim 10 wherein said alloy includes the metals barium, yttrium and copper.

12. The method of claim 10 wherein said first electrode is a metal substrate coated with said alloy.

13. The method of claim 10 wherein said electrolyte includes ozone or $CF_3N0$.

14. The method of claim 10 wherein said electrolyte is held substantially near the temperature at which said oxide becomes superconducting.

15. The method of claim 4 wherein said first electrode is composed substantially of La, said electrolyte is boron bearing and said composition formed is $LaB_6$.

16. The method of claim 4 wherein said first electrode is composed substantially of an alloy of Fe and Nd, said electrolyte is boron bearing and said composition formed is a neodymium iron boron magnetic material.

17. The method of claim 16 wherein said alloy is $Nd_2Fe_{14}$ and said composition is $Nd_2Fe_{14}B$.

18. The method of claim 16 or 17 wherein said electrolyte includes $BF_3$, a fluoride salt and $B_2O_3$.

19. A method of chemical fabrication for producing a chemical composition consisting of at least two constituents at low temperatures in an electrochemical cell comprising the steps:
   providing a first electrode comprised of a select material which acts as a substrate upon which said composition is fabricated,
   providing a second electrode to act as a counter electrode in said cell,
   immersing said first and second electrodes in cryogenic electrolyte,
   said electrolyte contributes said constituents to fabricate said composition, and
   providing an electrical potential difference between said first and second electrodes whereby said constituents of said electrolyte are preferentially attracted to said first electrode on which they discharge and then chemically react to produce said composition at said first electrode.

20. The method of claim 19 wherein said first electrode is the cathode and said second electrode is the anode.

21. The method of claim 20 wherein said first electrode is an inert metal, said electrolyte includes a Ga salt and an As salt and said composition is GaAs.

22. The method of claim 20 wherein said first electrode is an inert metal, said electrolyte includes $La_2O_3$ and $B_2O_3$ and said composition is $LaB_6$.

23. The method of claim 20 wherein said first electrode is a heavily doped semiconductor.

24. The method of claim 23 wherein said first electrode is heavily doped Si.

25. A method of chemical fabrication for producing a chemical composition composed of at least two elemental constituents at low temperatures in an electrochemical cell comprising the steps of:
providing a first electrode said first electrode comprising a consumable electrode that electrodissolves upon being polarized and supplies at least one constituent to said composition,
providing a second electrode to act as a counter electrode in said cell,
immersing said first and second electrodes in cryogenic electrolyte, and
providing an electrical potential difference between said first and second electrode whereby said constituents of said composition form said composition at said second electrode.

26. The method of claim 25 wherein the electrolyte contributes at least one constituent of said composition.

27. The method of claim 26 wherein said consumable electrode is the anode, comprised substantially of boron and electrodissolves to produce boron ions, said electrolyte is lanthanum bearing and said composition is $LaB_6$.

28. The method of claim 25 or 26 wherein the second electrode contributes at least one constituent to said composition.

29. The method of claim 28 wherein said first consumable electrode is the anode, comprised substantially of boron and electrodissolves to produce boron ions, and said second electrode is the cathode composed substantially of lanthanum and said composition is $LaB_6$ formed by reaction of said boron ions with said cathode.

30. The method of claim 28 wherein said first consumable electrode is the anode, comprised substantially of boron and electrodissolves to produce boron ions, said second electrode is composed of Fe and said electrolyte is neodymium bearing and said composition is $Nd_2Fe_{14}B$.

31. The method of claim 25 wherein the consumable electrode supplies all the constituents of said composition.

32. The method of claim 31 further comprising a plurality of consumable electrodes for supplying the constituents of said composition.

33. The method of claim 32 wherein a first consumable electrode is comprised substantially of boron, a second consumable electrode is comprised substantially of lanthanum, and said first and second electrodes being anodes that electrodissolve to provide ions and said composition is $LaB_6$.

34. The method of claim 1, 2, 19 or 25 wherein the thickness of said composition may be controlled coulometrically.

35. The method of claim 1, 2, 19 or 25 wherein the temperature of said electrolyte is less than or substantially equal to 0° C.

36. The method of claim 1, 2, 19 or 25 wherein said composition is of substantially greater length than thickness and the conductance of said composition is substantially greater along points on a single face of said length than across said thickness.

37. The method of claim 1, 2, 19, or 25 wherein said first electrode is masked to affect fabrication of said composition only at select locations on said first electrode.

38. The method of claim 37 wherein said masking and fabrication is repeated to affect fabrication of various compositions at various select locations on said first electrode.

39. The method of claims 1, 2, 19, or 25 wherein said fabrication is repeated to affect fabrication of various compositions at a single location on said first electrode.

40. The method of claim 39 wherein said various compositions include semiconductors and superconductors to produce a hybridized circuit.

* * * * *